US012597753B2

(12) United States Patent

Niemann et al.

(10) Patent No.: US 12,597,753 B2
(45) Date of Patent: Apr. 7, 2026

(54) PACKED-BED FILTER FOR METAL FLUORIDE DUST TRAPPING IN LASER DISCHARGE CHAMBERS

(71) Applicant: Cymer, LLC, San Diego, CA (US)

(72) Inventors: Ulrich Niemann, San Diego, CA (US); Walter Dale Gillespie, Poway, CA (US)

(73) Assignee: Cymer, LLC, San Diego, CA (US)

( * ) Notice: Subject to any disclaimer, the term of this patent is extended or adjusted under 35 U.S.C. 154(b) by 951 days.

(21) Appl. No.: 17/786,654

(22) PCT Filed: Dec. 10, 2020

(86) PCT No.: PCT/US2020/064374

§ 371 (c)(1),
(2) Date: Jun. 17, 2022

(87) PCT Pub. No.: WO2021/133568

PCT Pub. Date: Jul. 1, 2021

(65) Prior Publication Data

US 2023/0008480 A1      Jan. 12, 2023

Related U.S. Application Data

(60) Provisional application No. 62/953,101, filed on Dec. 23, 2019.

(51) Int. Cl.
*B03C 3/155* (2006.01)
*B03C 3/41* (2006.01)
(Continued)

(52) U.S. Cl.
CPC .......... *H01S 3/08059* (2013.01); *B03C 3/155* (2013.01); *B03C 3/41* (2013.01); (Continued)

(58) Field of Classification Search
CPC .... H01S 3/08059; H01S 3/104; H01S 3/2207; H01S 3/2308; H01S 3/0343; H01S 3/036; (Continued)

(56) References Cited

U.S. PATENT DOCUMENTS

| | | | | | |
|---|---|---|---|---|---|
| 4,001,147 | A | * | 1/1977 | Chamberlin | ............. B01J 20/22 |
| | | | | | 521/146 |
| 6,018,537 | A | * | 1/2000 | Hofmann | ........... G03F 7/70558 |
| | | | | | 372/86 |

(Continued)

FOREIGN PATENT DOCUMENTS

| | | |
|---|---|---|
| CN | 1674205 A | 9/2005 |
| CN | 101638529 A | 2/2010 |

(Continued)

OTHER PUBLICATIONS

Office Action, counterpart Korean Patent Application No. 10-2022-7022230, mailed Sep. 13, 2023, 8 pages total (including English translation of 3 pages).

(Continued)

*Primary Examiner* — Xinning(Tom) Niu
(74) *Attorney, Agent, or Firm* — DiBerardino McGovern IP Group LLC

(57) ABSTRACT

A light source apparatus (200) includes a gas discharge stage (210) and a metal fluoride trap (300). The gas discharge stage includes an optical amplifier (206) and a set of optical elements (250, 260). The optical amplifier includes a chamber (211) configured to hold a gas discharge medium (213), the gas discharge medium outputting a light beam. The set of optical elements is configured to form an optical resonator around the optical amplifier. The metal fluoride trap is configured to trap metal fluoride dust generated from the gas discharge stage. The metal fluoride trap includes an electrostatic precipitator (320) and a packed-bed filter (400, 402, 404) disposed around the electrostatic precipitator. The (Continued)

packed-bed filter includes a plurality of beads configured (406, 408) to absorb metal fluoride dust (208).

21 Claims, 4 Drawing Sheets

(51) Int. Cl.

| | |
|---|---|
| *B03C 3/49* | (2006.01) |
| *G03F 7/00* | (2006.01) |
| *H01S 3/08* | (2023.01) |
| *H01S 3/104* | (2006.01) |
| *H01S 3/22* | (2006.01) |
| *H01S 3/23* | (2006.01) |
| *H04Q 11/00* | (2006.01) |

(52) U.S. Cl.
CPC ............ *B03C 3/49* (2013.01); *G03F 7/70575* (2013.01); *H01S 3/104* (2013.01); *H01S 3/2207* (2013.01); *H01S 3/2308* (2013.01); *B03C 2201/04* (2013.01); *H04Q 2011/0016* (2013.01)

(58) Field of Classification Search
CPC ....... H01S 3/225; H01S 3/0346; B03C 3/155; B03C 3/41; B03C 3/49; B03C 2201/04; B03C 3/017; G03F 7/70575; H04Q 2011/0016
See application file for complete search history.

(56) References Cited

U.S. PATENT DOCUMENTS

| | | | | |
|---|---|---|---|---|
| 6,240,117 | B1 * | 5/2001 | Gong | .................. G03F 7/70558 372/57 |
| 6,566,667 | B1 | 5/2003 | Partlo et al. | |
| 7,819,945 | B2 | 10/2010 | Morton et al. | |
| 7,885,309 | B2 | 2/2011 | Ershov et al. | |
| 8,126,027 | B2 | 2/2012 | Algots et al. | |
| 2002/0021731 | A1 | 2/2002 | Bragin et al. | |
| 2004/0057896 | A1 * | 3/2004 | Kronholm | .............. B82Y 40/00 422/171 |
| 2010/0107870 | A1 | 5/2010 | Morton et al. | |

FOREIGN PATENT DOCUMENTS

| | | | | |
|---|---|---|---|---|
| CN | 107673606 | A | 2/2018 | |
| CN | 108434875 | A | 8/2018 | |
| CN | 108914163 | A | 11/2018 | |
| EP | 1654499 | B1 * | 11/2009 | ............ B01D 50/20 |
| JP | H07226550 | A | 8/1995 | |
| JP | 2001129338 | A | 5/2001 | |
| JP | 2002-118309 | A | 4/2002 | |
| JP | 2006140381 | A | 6/2006 | |
| JP | 2007021380 | A * | 2/2007 | |
| JP | 2019006610 | A | 1/2019 | |
| KR | 2001-0032868 | A | 4/2001 | |
| TW | 187209 | | 7/1992 | |
| WO | 199930392 | A1 | 6/1999 | |
| WO | 2013160083 | A1 | 10/2013 | |
| WO | 2016052440 | A1 | 4/2016 | |

OTHER PUBLICATIONS

Stefan Riechel, European International Searching Authority, International Search Report and Written Opinion, counterpart PCT Application No. PCT/US2020/064374, mailed Apr. 14, 2021, 14 pages total.
Office Action, counterpart Japanese Patent Application No. 2022-534646, mailed May 22, 2023, 5 pages total (including English translation of 3 pages).

* cited by examiner

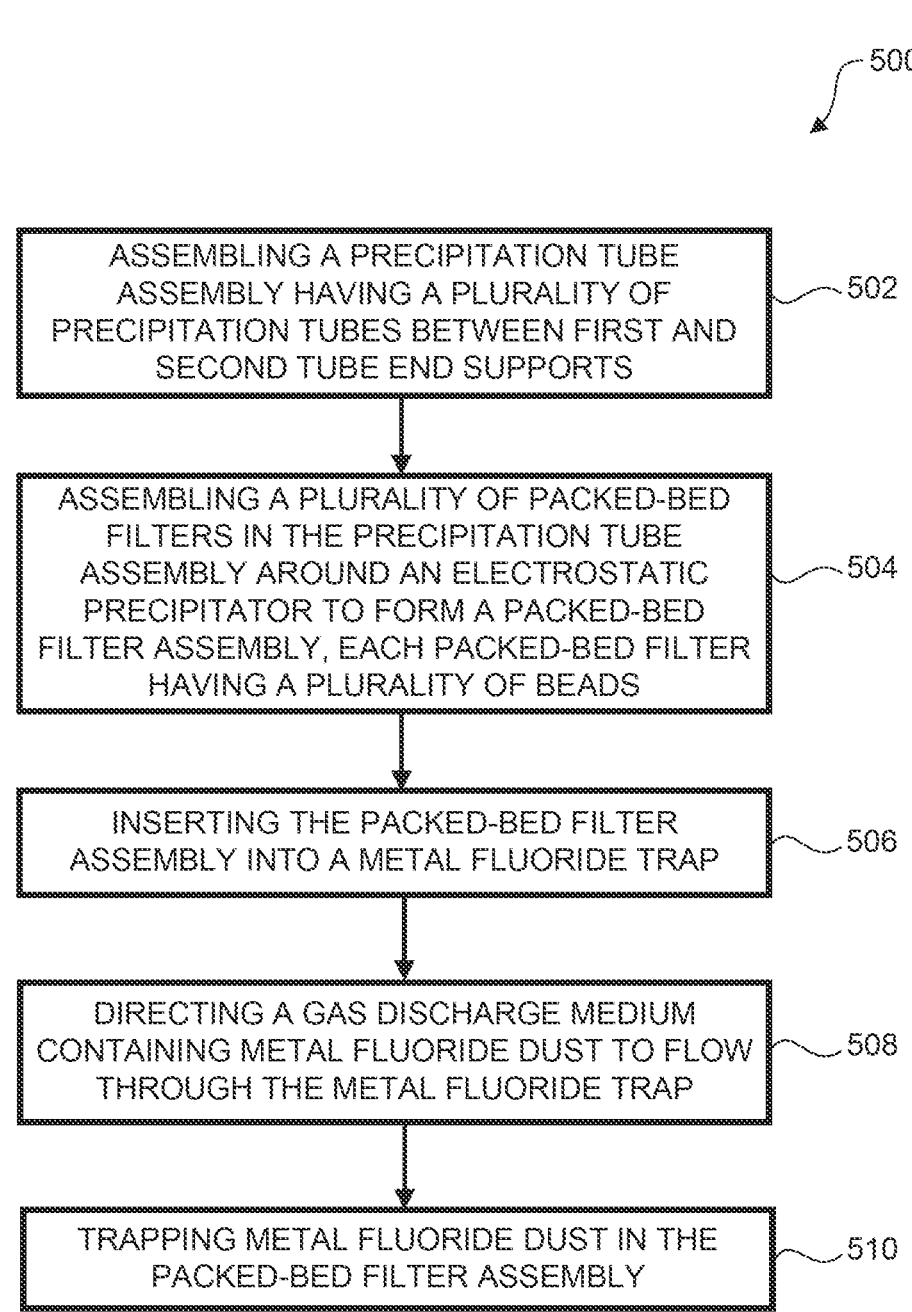

500

ASSEMBLING A PRECIPITATION TUBE
ASSEMBLY HAVING A PLURALITY OF
PRECIPITATION TUBES BETWEEN FIRST AND
SECOND TUBE END SUPPORTS — 502

ASSEMBLING A PLURALITY OF PACKED-BED
FILTERS IN THE PRECIPITATION TUBE
ASSEMBLY AROUND AN ELECTROSTATIC
PRECIPITATOR TO FORM A PACKED-BED
FILTER ASSEMBLY, EACH PACKED-BED FILTER
HAVING A PLURALITY OF BEADS — 504

INSERTING THE PACKED-BED FILTER
ASSEMBLY INTO A METAL FLUORIDE TRAP — 506

DIRECTING A GAS DISCHARGE MEDIUM
CONTAINING METAL FLUORIDE DUST TO FLOW
THROUGH THE METAL FLUORIDE TRAP — 508

TRAPPING METAL FLUORIDE DUST IN THE
PACKED-BED FILTER ASSEMBLY — 510

FIG. 5

PACKED-BED FILTER FOR METAL FLUORIDE DUST TRAPPING IN LASER DISCHARGE CHAMBERS

CROSS REFERENCE TO RELATED APPLICATIONS

This application claims priority to U.S. Application No. 62/953,101 filed Dec. 23, 2019 and titled PACKED-BED FILTER FOR METAL FLUORIDE DUST TRAPPING IN LASER DISCHARGE CHAMBERS, which is incorporated herein in its entirety by reference.

FIELD

The present disclosure relates to light source apparatuses and systems, for example, a light source with a metal fluoride trap for lithographic apparatuses and systems.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask, a reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, deep ultraviolet (DUV) radiation with a wavelength of 157 nm or 193 nm or 248 nm.

A master oscillator power amplifier (MOPA) is a two-stage optical resonator arrangement that produces a highly coherent amplified light beam. The performance of the MOPA can depend critically on the master oscillator (MO). Electrodes of the MO surrounding a gas discharge medium can degrade over time and produce metal fluoride dust. The metal fluoride dust can settle on optical windows of the MO and can lead to optical damage. Further, circulation of metal fluoride dust in the MO can also lead to reduced discharge voltage from the electrodes and poor laser performance.

SUMMARY

Accordingly, there is a need to increase metal fluoride dust trapping capacity, reduce metal fluoride dust in the gas discharge medium and on the optical windows, improve control of flow distribution through a metal fluoride trap, provide efficient cleaning and/or replacement of metal fluoride trap components, and increase the service lifetime of the master oscillator.

In some embodiments, a light source apparatus includes a gas discharge stage and a metal fluoride trap. The gas discharge stage includes an optical amplifier and a set of optical elements. The optical amplifier includes a chamber configured to hold a gas discharge medium, the gas discharge medium outputting a light beam. The set of optical elements is configured to form an optical resonator around the optical amplifier. The metal fluoride trap is configured to trap metal fluoride dust generated from the gas discharge stage. The metal fluoride trap includes an electrostatic precipitator and a packed-bed filter disposed around the electrostatic precipitator. The packed-bed filter includes a plurality of beads configured to absorb metal fluoride dust. The absorption may include mechanical trapping of the dust particles in the interstitial spaces between the beads and/or chemical interaction with the surfaces of the beads (e.g., adsorption).

In some embodiments, the packed-bed filter includes a total surface area configured to control a flow rate of the gas discharge medium through the metal fluoride trap.

In some embodiments, the packed-bed filter includes a plurality of packed-bed filters separated by a baffle. In some embodiments, each of the plurality of packed-bed filters is different. In some embodiments, each of the plurality of packed-bed filters has a different surface area. In some embodiments, each of the plurality of packed-bed filters has a different packing density.

In some embodiments, each of the plurality of beads is spherical and has a smooth polished exterior surface. In some embodiments, the plurality of beads includes a fluoride corrosion resistant material. In some embodiments, the plurality of beads includes a first plurality of beads and a second plurality of beads different from the first plurality of beads.

In some embodiments, the gas discharge medium includes an excimer medium and/or an exciplex medium (which may also be called an excimer medium). In some embodiments, the gas discharge medium includes $F_2$, ArF, KrF, and/or XeF.

In some embodiments, the set of optical elements includes an optical coupler (OC) in optical communication with a first optical port of the chamber and a linewidth narrowing module (LNM) in optical communication with a second optical port of the chamber.

In some embodiments, the light source apparatus further includes a pressure control system coupled to the gas discharge stage and configured to direct a portion of the gas discharge medium to flow through an input port of the metal fluoride trap, through the packed-bed filter, and through one or more output ports of the metal fluoride trap.

In some embodiments, a metal fluoride trap configured to trap metal fluoride dust generated in a gas discharge medium of a gas discharge stage includes an electrostatic precipitator and a packed-bed filter disposed around the electrostatic precipitator. The packed-bed filter includes a plurality of beads configured to absorb metal fluoride dust in the gas discharge medium.

In some embodiments, the packed-bed filter includes a total surface area configured to control a flow rate of the gas discharge medium through the metal fluoride trap.

In some embodiments, each of the plurality of beads is spherical. In some embodiments, each bead has a diameter of about 1 mm to about 10 mm. In some embodiments, each bead includes a smooth polished exterior surface.

In some embodiments, plurality of beads includes a fluoride corrosion resistant material. In some embodiments, the fluoride corrosion resistant material includes a glass-like component, a crystalline component, a metal, and/or an oxide. In some embodiments, the fluoride corrosion resistant material includes aluminum, duralumin, alumina, nickel, monel, brass, copper, zinc, calcium boride, and/or calcium fluoride.

In some embodiments, the plurality of beads includes a first plurality of beads and a second plurality of beads different from the first plurality of beads. In some embodiments, the first plurality of beads includes a first dimension and the second plurality of beads includes a second dimension different from the first dimension. In some embodiments, the first plurality of beads includes a first material and the second plurality of beads includes a second material different from the first material.

In some embodiments, a method of trapping metal fluoride dust generated in a gas discharge medium of a gas discharge stage in a metal fluoride trap includes assembling a precipitation tube assembly comprising a plurality of precipitation tubes between a first tube end support and a second tube end support. In some embodiments, the method further includes assembling a plurality of packed-bed filters in the precipitation tube assembly around an electrostatic precipitator to form a packed-bed filter assembly. Each packed-bed filter includes a plurality of beads configured to absorb metal fluoride dust in the gas discharge medium. In some embodiments, the method further includes inserting the packed-bed filter assembly into the metal fluoride trap. In some embodiments, the method further includes directing the gas discharge medium to flow through the metal fluoride trap. In some embodiments, the method further includes trapping metal fluoride dust in the packed-bed filter assembly.

In some embodiments, the assembling the plurality of packed-bed filters includes filling the plurality of beads between the plurality of precipitation tubes. In some embodiments, the filling includes filling an inner plurality of beads between an inner plurality of precipitation tubes and filling an outer plurality of beads different from the inner plurality of beads between an outer plurality of precipitation tubes. In some embodiments, the outer plurality of beads includes a surface area and/or a packing density different from the inner plurality of beads.

In some embodiments, the method further includes removing the plurality of beads from the packed-bed filter assembly, washing the plurality of beads, and reassembling the plurality of beads in the packed-bed filter assembly. In some embodiments, the method further includes removing the plurality of beads from the packed-bed filter assembly and reassembling a second plurality of beads in the packed-bed filter assembly.

Implementations of any of the techniques described above may include an EUV light source, a DUV light source, a system, a method, a process, a device, and/or an apparatus. The details of one or more implementations are set forth in the accompanying drawings and the description below. Other features will be apparent from the description and drawings, and from the claims.

Further features and exemplary aspects of the embodiments, as well as the structure and operation of various embodiments, are described in detail below with reference to the accompanying drawings. It is noted that the embodiments are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the embodiments and, together with the description, further serve to explain the principles of the embodiments and to enable a person skilled in the relevant art(s) to make and use the embodiments.

FIG. 5 illustrates a flow diagram for trapping metal fluoride dust, according to an embodiment.

Figure 1:
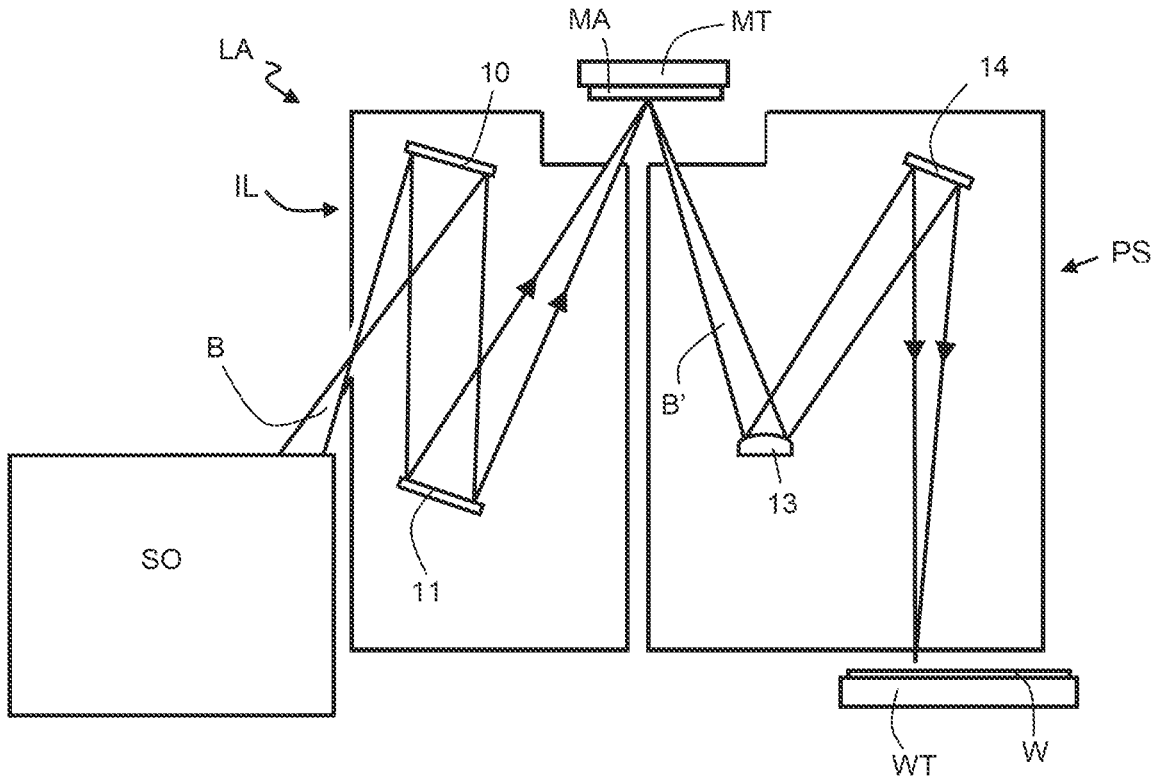
FIG. 1 is a schematic illustration of a lithographic apparatus, according to an embodiment.

The features and exemplary aspects of the embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this present invention. The disclosed embodiment(s) merely exemplify the present invention. The scope of the invention is not limited to the disclosed embodiment(s). The present invention is defined by the claims appended hereto.

The embodiment(s) described, and references in the specification to "one embodiment," "an embodiment," "an exemplary embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, ±2%, ±5%, ±10%, or ±15% of the value).

The term "absorb" or "absorption" as used herein can include adsorb and adsorption.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/ or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Exemplary Lithographic System

FIG. 1 shows a lithographic system comprising a radiation source SO and a lithographic apparatus LA. The radiation source SO is configured to generate an EUV and/or a DUV radiation beam B and to supply the EUV and/or DUV radiation beam B to the lithographic apparatus LA. The lithographic apparatus LA comprises an illumination system IL, a support structure MT configured to support a patterning device MA (e.g., a mask), a projection system PS, and a substrate table WT configured to support a substrate W.

The illumination system IL is configured to condition the EUV and/or DUV radiation beam B before the EUV and/or DUV radiation beam B is incident upon the patterning device MA. Thereto, the illumination system IL may include a faceted field mirror device 10 and a faceted pupil mirror device 11. The faceted field mirror device 10 and faceted pupil mirror device 11 together provide the EUV and/or DUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV and/or DUV radiation beam B interacts with the patterning device MA. This interaction may be reflective (as shown), which may be preferred for EUV radiation. This interaction may be transmissive, which may be preferred for DUV radiation. As a result of this interaction, a patterned EUV and/or DUV radiation beam B' is generated. The projection system PS is configured to project the patterned EUV and/or DUV radiation beam B' onto the substrate W. For that purpose, the projection system PS may comprise a plurality of mirrors 13, 14 which are configured to project the patterned EUV and/or DUV radiation beam B' onto the substrate W held by the substrate table WT. The projection system PS may apply a reduction factor to the patterned EUV and/or DUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV and/or DUV radiation beam B', with a pattern previously formed on the substrate W.

Exemplary Light Source Apparatus

As discussed above, a master oscillator power amplifier (MOPA) is a two-stage optical resonator arrangement. The master oscillator (MO) (e.g., first optical resonator stage) produces a highly coherent light beam. The power amplifier (PA) (e.g., second optical resonator stage) increases the optical power of the light beam while preserving the beam properties. The MO can include a gas discharge chamber, an optical coupler (OC), and a linewidth narrowing module (LNM). The OC and the LNM can surround the gas discharge chamber to form an optical resonator.

Performance of the MOPA can depend critically on the MO, for example, the optical windows of the MO that output the light beam. An excimer laser utilizes an excimer medium to output extreme ultraviolet (EUV) radiation and/or deep ultraviolet (DUV) radiation. Other gas lasers may use other media (e.g., $F_2$ lasers). An excimer is a short-lived molecule ("excited dimer") formed from two atoms of the same species (e.g., $Ar_2$, $Kr_2$, $Xe_2$). The term excimer also refers to exciplex media ("excited complex"), in which the short-lived molecule is formed from more than two species (e.g., ArF, KrCl, KrF, XeBr, XeCl, XeF). Electrodes of the MO surrounding the gas discharge medium (e.g., $F_2$, ArF, KrF, and/or XeF) can degrade over time and produce metal fluoride dust (e.g., average diameter of about 2.0 μm). Metal fluoride dust can settle on the optical windows of the MO and can lead to optical damage (e.g., local thermal adsorption and/or heating). Further, circulation of metal fluoride dust in the MO can also lead to reduced discharge voltage from the electrodes and poor laser performance.

In some embodiments, a metal fluoride trap (MFT) can be coupled to the chamber of the MO to reduce contamination in the gas discharge medium. For example, certain MFTs have been previously described in U.S. Pat. No. 6,240,117, issued May 29, 2001, and U.S. Pat. No. 7,819,945, issued Oct. 26, 2010, which are hereby incorporated by reference herein in their entireties. As a portion of the gas discharge medium passes through the MFT, metal fluoride dust in the contaminated gas discharge medium is absorbed in the trap filter and any remaining particles are collected by an electrostatic precipitator. The electrostatic precipitator induces an electrostatic charge in the dust particles flowing through the MFT via a strong electric field (e.g., applied potential of several kV). For example, a voltage can be applied to a center wire passing axially through a precipitation tube (e.g., cylindrical) that creates an electrostatic charge on the inner surface of the precipitation tube. Any remaining metal fluoride dust adheres to the inner surface of the precipitation tube. The resulting clean gas can be circulated back into the MO chamber through the optical window housings to keep the windows free from dust.

In some embodiments, MFT mechanisms use layers of meshed screens (e.g., brass weave meshes) with an electrostatic precipitator. However, the meshed screens may not be easily cleaned after use and may be replaced over time. Also, the meshed screens can collect metal fluoride dust disproportionally over time (e.g., hot spots of high density regions) that affects a flow rate through the MFT. Over time, the dust trapping capacity (e.g., total surface area) can decrease, which is the critically limiting factor to laser lifetime and the outputted light beam, for example, to a DUV lithographic apparatus.

In some embodiments, packed-bed filters can be used to filter media, for example, a gas discharge medium. Generally, packed-bed filters have been used in chemical processing (e.g., chemical reactors, distillation, scrubbers, etc.) and environmental engineering (e.g., air filtration, water filtration, waste filtration, etc.). Generally, in chemical applications, packed-beds are used to provide the maximum surface area for a chemical conversion of a fluid due to thermal or catalytic processes and subsequently release the fluid back into the flow without any residue on the packing material. Packed-bed filters can include structured packing (e.g., Raschig ring, columns, etc.) and/or catalyst particles or absorbents (e.g., zeolite pellets, activated carbon, sand, gravel, etc.). For example, when absorbents (e.g., spheres) are randomly added to a container and then shaken, they will generally form what is known as an "irregular" or "jammed" packing configuration that is the highest packing density absent deliberate assembly. This irregular packing will generally have a density of about 64%. Packed-bed filters for an excimer system may be different from general packed-bed filters. For example, packed-bed filters in excimer systems should be resistant to corrosion (e.g., $F_2$, $Cl_2$, etc.) and should not contaminate the gas discharge medium.

In some embodiments, a MFT with a packed-bed filter comprising a plurality of beads (e.g., brass, alumina, crystalline, glass-like, etc.) can (1) increase metal fluoride dust trapping capacity (e.g., larger surface area than previous traps, e.g., brass weave meshes); (2) provide control of the flow distribution in the MFT (e.g., uniform and/or optimized flow) due to the type of beads and/or distribution of beads; (3) tailor and/or optimize flow rate, trapping capacity, and/or flow distribution in the MFT by using customized beads and/or different arrangements of beads (e.g., size, shape, material, roughness, surface area, packing density, functionalization, etc.); and (4) allow for efficient cleaning and/or replacement of packed-bed filters after sufficient adsorption of metal fluoride dust.

In some embodiments, a packed-bed filter comprising a plurality of beads can have an irregular packing configuration (e.g., packing density of about 64%). For example, the resulting void fraction in conjunction with an internal volume of the MFT and an entry flow rate can be used to calculate a flow velocity of the chamber gas through the MFT. In some embodiments, the addition of space-occupying bodies (e.g., smaller beads or sub-beads) can be used to tune a flow velocity of the chamber gas through the MFT.

In some embodiments, a packed-bed filter comprising a plurality of beads can be arranged in a random loose pack (RLP), in a random close pack (RCP) (e.g., "irregular" packing configuration), in a mono-sized sphere packing (e.g., face-centered cubic (FCC)), in a multi-sized sphere packing (e.g., FCC with smaller diameter beads to fill vacancies), or the like. For example, the plurality of beads can be arranged in a RLP (e.g., packing density of about 60%), a RCP (e.g., packing density of about 64%), a mono-sized sphere packing (e.g., packing density of about 74%), and/or a multi-sized sphere packing (e.g., packing density of about 93%).

In some embodiments, a packed-bed filter comprising a plurality of beads (e.g., spheres) can have a bead diameter such that a particle trapping capacity and a probability of clogging a flow of chamber gas can be optimized. For example, bead diameter and a preferred volume of trapped dust particles can be determined such that the probability of clogging (e.g., choked flow) and/or complete blockage is minimized (e.g., a model and/or calculation can be minimized based on the fact that the flow is most dominantly decelerated near touching points of the beads, where almost stagnant flow conditions allow particles to separate from the flow and adhere to the bead surface first, followed by subsequent dust particle agglomeration).

In some embodiments, a function of the packed-bed filter comprising a plurality of beads (e.g., spheres) is the opposite of the above-mentioned general packed-bed filters for chemical applications such that the beads of the packed-bed filter in the MFT provide a surface to absorb and/or capture dust particles (e.g., rather than subsequently releasing the dust particles back into the flow without any residue on the packing material).

In some embodiments, an effect of the packed-bed filter comprising a plurality of beads (e.g., spheres) is to provide improved mixing by enabling random and/or changing flow paths that are favorable to screens (e.g., brass weave meshes) that will saturate on preferred surfaces and cause superficial bypass flows with decreased capturing efficacy. For example, flow can be dynamically balanced by a path of minimum flow resistance, without a change in trapping efficacy due to a dimension-controlled packing density of beads (e.g., irregular packing configuration with a packing density of about 64%).

In some embodiments, the packed-bed filter comprising a plurality of beads (e.g., spheres) can be pre-assembled into a cylindrical ring cartridge that can slide into the MFT. For example, the cylindrical ring cartridge can provide further options in assembling and packing the bed without exposing the entire MFT to vibrations and/or manipulations that may impact MFT functionality.

Embodiments of light source apparatuses and systems as discussed below may increase metal fluoride dust trapping capacity, reduce metal fluoride dust in the gas discharge medium and on the optical windows, improve control of flow distribution through the metal fluoride trap, provide efficient cleaning and/or replacement of metal fluoride trap components, and increase the service lifetime of the master oscillator to provide an excimer laser beam, for example, to a DUV lithographic apparatus.

Figure 2:
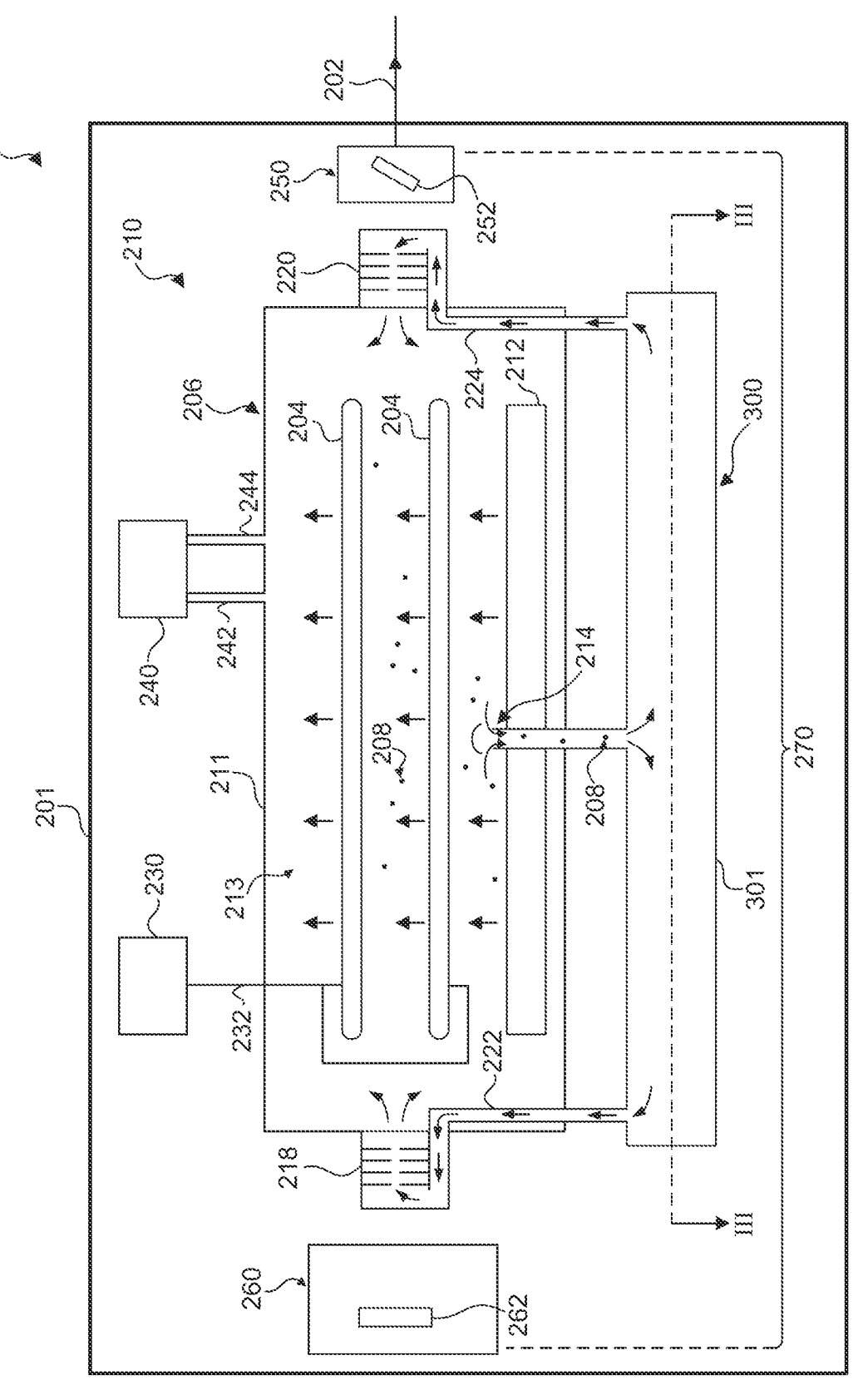
FIG. 2 is a schematic illustration of a light source apparatus, according to an embodiment.
Figure 3:
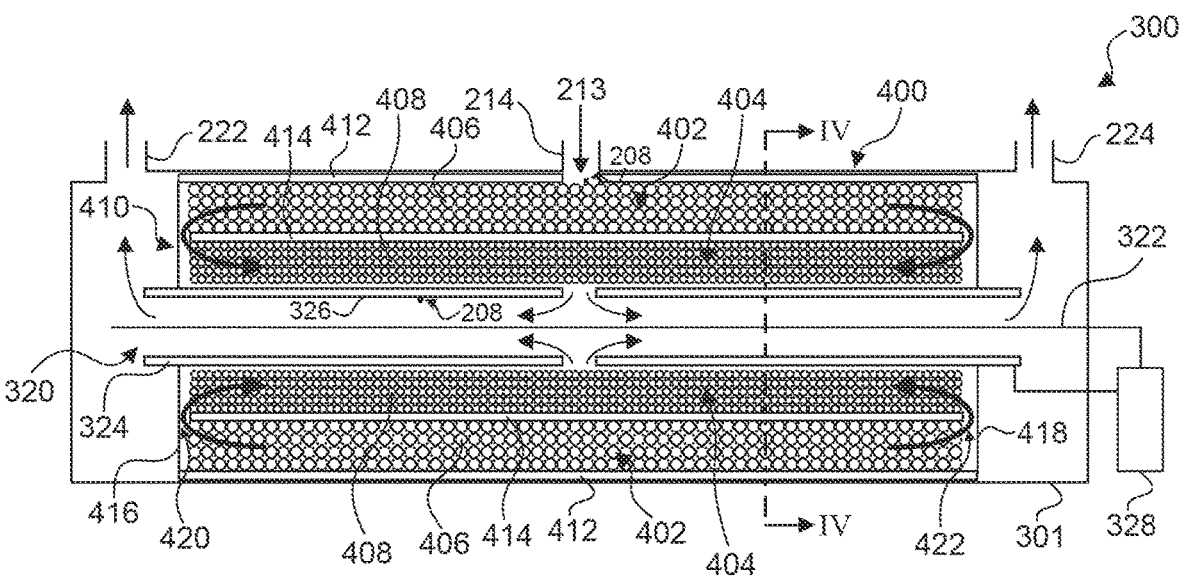
FIG. 3 is a schematic cross-sectional illustration of a metal fluoride trap of the light source apparatus shown in FIG. 2, according to an embodiment.
Figure 4:
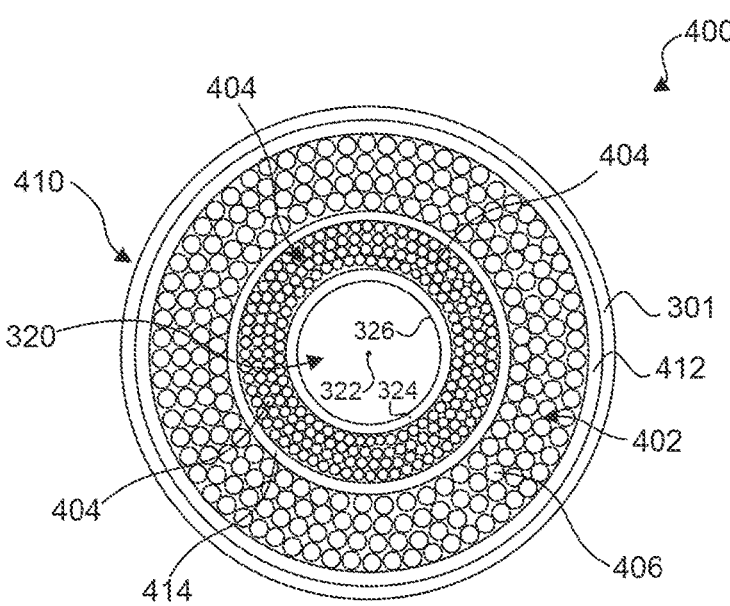
FIG. 4 is a schematic cross-sectional illustration of a packed-bed filter assembly of the metal fluoride trap shown in FIG. 3, according to an embodiment.

FIGS. 2-4 illustrate light source apparatus 200, according to various exemplary embodiments. FIG. 2 is a schematic illustration of light source apparatus 200, according to an exemplary embodiment. FIG. 3 is a schematic cross-sectional illustration of metal fluoride trap 300 of light source apparatus 200 shown in FIG. 2, according to an exemplary embodiment. FIG. 4 is a schematic cross-sectional illustration of packed-bed filter assembly 400 of metal fluoride trap 300 shown in FIG. 3, according to an exemplary embodiment.

FIG. 2 illustrates light source apparatus 200, according to various exemplary embodiments. Light source apparatus 200 can be configured to reduce metal fluoride dust contamination in gas discharge stage 210 (e.g., MO) and provide a highly coherent and aligned light beam (e.g., light beam 202), for example, to a DUV lithographic apparatus (e.g., LA). Light source apparatus 200 can be further configured to reduce metal fluoride dust accumulation on first and second optical windows 218, 220 and increase the service lifetime and laser performance of gas discharge stage 210 (e.g., MO). Although light source apparatus 200 is shown in FIG. 2 as a stand-alone apparatus and/or system, the embodiments of this disclosure can be used with other optical systems, such as, but not limited to, radiation source SO, lithographic apparatus LA, and/or other optical systems. In some embodiments, light source apparatus 200 can be radiation source SO in lithographic apparatus LA. For example, EUV and/or DUV radiation beam B can be light beam 202. In some embodiments, light source apparatus 200 can be a MOPA formed by gas discharge stage 210 (e.g., MO) and a power ring amplifier (PRA) stage (e.g., PA) (not shown).

As shown in FIG. 2, light source apparatus 200 can include gas discharge stage 210, voltage control system 230, pressure control system 240, and metal fluoride trap (MFT) 300. In some embodiments, all of the above listed components can be housed in a three-dimensional (3D) frame 201. For example, the 3D frame 201 can include a metal (e.g., aluminum, steel, etc.), a ceramic, and/or any other suitable rigid material.

Gas discharge stage 210 can be configured to output a highly coherent light beam (e.g., light beam 202). Gas discharge stage 210 can include optical amplifier 206, optical coupler (OC) 250, and linewidth narrowing module (LNM) 260. In some embodiments, OC 250 can include first optical resonator element 252 and LNM 260 can include second optical resonator element 262. Optical resonator 270 can be defined by OC 250 (e.g., via first optical resonator element 252) and LNM 260 (e.g., via second optical resonator element 262). First optical resonator element 252 can be partially reflective (e.g., partial mirror) and second optical resonator element 262 can be reflective (e.g., mirror, grating, etc.) to form optical resonator 270. Optical resonator 270 can direct light generated by optical amplifier 206 into optical amplifier 206 for a fixed number of passes to form light beam 202. In some embodiments, gas discharge stage 210 can output light beam 202 to a PRA stage (not shown) as part of a MOPA arrangement.

As shown in FIG. 2, optical amplifier 206 can include chamber 211, first optical window 218, and second optical window 220. Chamber 211 can be configured to hold gas discharge medium 213 within first and second optical windows 218, 220. Chamber 211 can include electrodes 204, metal fluoride dust 208, blower 212, gas discharge medium 213, input port 214 directed toward MFT 300, first output port 222 directed toward first optical window 218, and second output port 224 directed toward second optical window 220. Input port 214 can be configured to transfer a portion of gas discharge medium 213 with metal fluoride dust 208 in chamber 211 into MFT 300. First and second output ports 222, 224 can be configured to transfer a portion of gas discharge medium 213 (e.g., clean gas with metal fluoride dust 208 removed) from MFT 300 back through chamber 211 to first and second optical windows 218, 220, respectively.

Optical amplifier 206 can be optically coupled to OC 250 and LNM 260. Optical amplifier 206 can be configured to output light beam 202. Light beam 202 can be produced in gas discharge medium 213 between electrodes 204 in chamber 211 in optical resonator 270 defined by OC 250 and LNM 260. Chamber 211 can be coupled to MFT 300 and first and second optical windows 218, 220. Gas discharge medium 213 can be circulated between electrodes 204 in chamber 211 by blower 212. In some embodiments, blower 212 can be a tangential blower. A portion of gas discharge medium 213 can be extracted at input port 214 downstream of blower 212 and directed through MFT 300. Clean gas can be circulated back into chamber 211 through first and second optical windows 218, 220 to keep them free of laser debris (e.g., metal fluoride dust 208). In some embodiments, blower 212 and/or pressure control system 240 (e.g., vacuum line 244) can maintain a flow rate from chamber 211 into MFT 300 (e.g., input port 214) of about 100 sccm.

Gas discharge medium 213 can be excited, e.g., by electrical discharge, to output light that is amplified in a laser cavity to produce light beam 202 (e.g., 157 nm or 193 nm or 248 nm). In some embodiments, gas discharge medium 213 can include a gas for excimer lasing (e.g., $Ar_2$, $Kr_2$, $F_2$, $Xe_2$, ArF, KrCl, KrF, XeBr, XeCl, XeF, etc.). For example, gas discharge medium 213 can include ArF and, upon excitation (e.g., applied voltage) from surrounding electrodes 204 in chamber 211, output light beam 202 (e.g., 157 nm or 193 nm or 248 nm) through first and second optical windows 218, 220. In some embodiments, gas discharge medium 213 can include an excimer medium. For example, gas discharge medium 213 can include $F_2$, ArF, KrF, and/or XeF.

OC 250 can be configured to be in optical communication with second optical window 220. In some embodiments, OC 250 can be configured to partially reflect a light beam and form part of optical resonator 270. For example, OCs have been previously described in U.S. Pat. No. 7,885,309, issued Feb. 8, 2011, which is hereby incorporated by reference herein in its entirety. As shown in FIG. 2, OC 250 can include first optical resonator element 252 to direct light (e.g., light beam 202) from optical amplifier 206 back into optical amplifier 206 and/or output light beam 202. First optical resonator element 252 can be adjusted (e.g., tilt).

LNM 260 can be configured to be in optical communication with first optical window 218. In some embodiments, LNM 260 can be configured to provide spectral line narrowing to a light beam and form part of optical resonator 270. For example, LNMs have been previously described in U.S. Pat. No. 8,126,027, issued Feb. 28, 2012, which is hereby incorporated by reference herein in its entirety. As shown in FIG. 2, LNM 260 can include second optical resonator element 262 to direct light (e.g., light beam 202) from optical amplifier 206 back into optical amplifier 206 toward OC 250. Second optical resonator element 262 can be adjusted (e.g., tilt, angular).

Voltage control system 230 can be configured to apply high voltage electrical pulses across electrodes 204 in chamber 211 to excite gas discharge medium 213 to output light beam 202 (e.g., 157 nm or 193 nm or 248 nm). Voltage control system 230 can include voltage supply line 232. In some embodiments, voltage control system 230 can include a high voltage power supply (not shown), a voltage compression amplifier (not shown), a pulse energy monitor (not shown), and/or a controller (not shown) for providing high voltage electrical pulses across electrodes 204. For example, a voltage control system has been previously described in U.S. Pat. No. 6,240,117, issued May 29, 2001, which is hereby incorporated by reference herein in its entirety.

Pressure control system 240 can be configured to control a fluorine concentration in chamber 211 and provide gas discharge medium 213 to chamber 211. Pressure control system 240 can include gas discharge line 242 and vacuum line 244. Gas discharge line 242 can be configured to provide one or more gas components (e.g., He, Ne, Ar, Kr, Xe, $F_2$, $Br_2$, $Cl_2$, etc.) of gas discharge medium 213 to chamber 211. Vacuum line 244 can be configured to provide a negative pressure (e.g., draw out) a portion of gas discharge medium 213 in chamber 211, for example, during injection of one or more gas components to gas discharge medium 213 through gas discharge line 242. In some embodiments, pressure control system 240 can include one or more gas sources (not shown), one or more pressure regulators (not shown), a vacuum pump (not shown), a fluorine ($F_2$) trap or other halogen trap, and/or a controller (not shown) for controlling a fluorine concentration in chamber 211 and refilling gas discharge medium 213 in chamber 211. For example, a pressure control system has been previously described in U.S. Pat. No. 6,240,117, issued May 29, 2001, which is hereby incorporated by reference herein in its entirety. In some embodiments, pressure control system 240 can be coupled to gas discharge stage 210 and configured to flow a portion of gas discharge medium 213 with metal fluoride dust 208 through input port 214 of MFT 300, through MFT 300 (e.g., packed-bed filter assembly 400), and through first and/or second output port 222, 224 of MFT 300.

Exemplary Metal Fluoride Trap (MFT)

FIG. 3 is a schematic cross-sectional illustration of MFT 300 of light source apparatus 200 shown in FIG. 2 (along the plane indicated by III-III in FIG. 2), according to an exemplary embodiment. FIG. 4 is a schematic cross-sectional illustration of packed-bed filter assembly 400 of MFT 300 shown in FIG. 3 (along the plane indicated by IV-IV in FIG. 3), according to an exemplary embodiment.

In some embodiments, MFT 300 can be configured to trap metal fluoride dust 208 generated in gas discharge medium 213 in chamber 211 of gas discharge stage 210. MFT 300 can be further configured to reduce metal fluoride dust 208 accumulation on first and second optical windows 218, 220 and increase the service lifetime and laser performance of gas discharge stage 210 (e.g., MO). Although MFT 300 is shown in FIG. 3 as a stand-alone apparatus and/or system, the embodiments of this disclosure can be used with other optical systems, such as, but not limited to, radiation source SO, lithographic apparatus LA, light source apparatus 200, and/or other optical systems. In some embodiments, MFT 300 can be external to 3D frame 201 of light source apparatus 200. For example, MFT 300 can be connected to chamber 211 via input port 214 and first and second output ports 222, 224 that can be extended so that MFT 300 is external to 3D frame 201.

In some embodiments, MFT 300 can include MFT frame 301, input port 214 coupled to chamber 211, first output port 222 coupled to chamber 211 and first optical window 218, second output port 224 coupled to chamber 211 and second optical window 220, electrostatic precipitator 320, and packed-bed filter assembly 400. In some embodiments, MFT frame 301 can be cylindrical. For example, MFT frame 301 can be about 10 mm (diameter) by about 100 mm (length).

In some embodiments, input port 214 can be configured to transfer a portion of gas discharge medium 213 with metal fluoride dust 208 in chamber 211 into MFT 300. As shown in FIG. 3, gas discharge medium 213 can flow through packed-bed filter assembly 400 toward electrostatic precipitator 320 and metal fluoride dust 208 can be absorbed in packed-bed filter assembly 400. First and second output ports 222, 224 can be configured to transfer a portion of gas discharge medium 213 (e.g., clean gas with metal fluoride dust 208 removed) that has passed through packed-bed filter assembly 400 and electrostatic precipitator 320 in MFT 300 back through chamber 211 to first and second optical windows 218, 220, respectively.

In some embodiments, electrostatic precipitator 320 can be configured to induce an electric charge in metal fluoride dust 208 flowing through the MFT 300 and promote adsorption of remaining metal fluoride dust 208. Electrostatic precipitator 320 can include center wire 322, precipitation tube 324, and high voltage supply 328. A high voltage (e.g., several kV) can be applied to center wire 322 via high voltage supply 328 in order to generate a strong electric field between center wire 322 and inner surface 326 of precipitation tube 324 (e.g., grounded). In some embodiments, center wire 322 can pass axially through precipitation tube 324 (e.g., cylindrical) in order to create an electrostatic charge on inner surface 326. Any remaining metal fluoride dust 208, after flowing through packed-bed filter assembly 400, can adhere to inner surface 326 when a high voltage difference (e.g., several kV) is applied between center wire 322 and inner surface 326. Electrostatic precipitator 320 can extend the length of MFT 300 beyond first and second tube end supports 416, 418 of packed-bed filter assembly 400.

In some embodiments, packed-bed filter assembly 400 can be configured to absorb metal fluoride dust 208 flowing through MFT 300. Packed-bed filter assembly 400 can include packed-bed filters 402, 404 and precipitation tube assembly 410. Packed-bed filter 402, 404 can include beads 406, 408 configured to absorb metal fluoride dust 208. In some embodiments, as shown in FIGS. 3 and 4, packed-bed filter 402, 404 can be disposed around electrostatic precipitator 320. In some embodiments, packed-bed filter 402, 404 has a total surface area (e.g., metal fluoride trapping capacity) defined by beads 406, 408. In some embodiments, the total surface area can be configured to control a flow rate of gas discharge medium 213 through MFT 300.

In some embodiments, packed-bed filter assembly 400 can include a plurality of packed-bed filters 402, 404 separated by a baffle (e.g., second precipitation tube 414). For example, as shown in FIGS. 3 and 4, packed-bed filter assembly 400 can include first (outer) packed-bed filter 402 and second (inner) packed-bed filter 404 separated by second precipitation tube 414. In some embodiments, packed-bed filter assembly 400 can include different packed-bed filters 402, 404. For example, as shown in FIGS. 3 and 4, packed-bed filter assembly 400 can include first (outer) packed-bed filter 402 with first plurality of beads 406 (e.g., larger diameter, smaller surface area, lower packing density, first material, first roughness, etc.) and second (inner) packed-bed filter 404 with second plurality of beads 408 (e.g., smaller diameter, larger surface area, higher packing density, second material, second roughness, etc.) that is different than first (outer) packed-bed filter 402. For example, first and second packed-bed filters 402, 404 can have different beads 406, 408 with different diameters, different surface areas, different packing densities, and/or different materials. Moreover, implementations with three or more packed-bed filters are also contemplated.

In some embodiments, first packed-bed filter 402 with first plurality of beads 406 and second packed-bed filter 404 with second plurality of beads 408 can be the same. For example, first and second plurality of beads 406, 408 can be identical (e.g., shape, size, material, etc.). In some embodiments, first packed-bed filter 402 with first plurality of beads 406 and second packed-bed filter 404 with second plurality of beads 408 can be different. For example, first and second plurality of beads 406, 408 can be different (e.g., shape, size, material, etc.).

In some embodiments, first and second pluralities of beads 406, 408 can be arranged in packed-bed filter 402, 404 in a random loose pack (RLP), in a random close pack (RCP) (e.g., with shaking), in a mono-sized sphere packing (e.g., face-centered cubic (FCC)), in a multi-sized sphere packing (e.g., FCC with smaller diameter beads to fill vacancies), or the like. For example, first and second pluralities of beads 406, 408 can be arranged in a RLP (e.g., packing density of about 60%), a RCP (e.g., packing density of about 64%), a mono-sized sphere packing (e.g., packing density of about 74%), and/or a multi-sized sphere packing (e.g., packing density of about 93%). In some embodiments, first packed-bed filter 402 and/or second packed-bed filter 404 can include both first and second pluralities of beads 406, 408. For example, first and second pluralities of beads 406, 408 can be arranged differently in first and second packed-bed filters 402, 404 such that first packed-bed filter 402 has a different packing density and total surface area than second packed-bed filter 404.

In some embodiments, beads 406, 408 can be spherical. For example, beads 406, 408 can have a diameter of about 1 mm to about 10 mm. In some embodiments, first plurality of beads 406 can have a diameter of about 5 mm to about 10 mm and second plurality of beads 408 can have a diameter of about 1 mm to about 5 mm. For example, first plurality of beads 406 can have a diameter of about 5 mm and second plurality of beads 408 can have a diameter of about 2 mm. In some embodiments, beads 406, 408 can have a smooth polished exterior surface. For example, beads 406, 408 can be ball bearings. In some embodiments, beads 406, 408 can include a fluoride corrosion resistant material. For example, beads 406, 408 can include a glass-like component, a crystalline component, a metal, and/or an oxide. For example, beads 406, 408 can include aluminum, duralumin, alumina, nickel, monel, brass, copper, zinc, calcium boride, calcium fluoride, and/or some combination thereof. In some embodiments, beads 406, 408 can have different materials. For example, first plurality of beads 406 can include a first material (e.g., brass) and second plurality of beads 408 can include a second material (e.g., alumina).

In some embodiments, precipitation tube assembly 410 can be configured to assemble beads 406, 408 in packed-bed filter assembly 400. Precipitation tube assembly 410 can include precipitation tube 412, 414, first tube end support 416, and second tube end support 418. Precipitation tube 412, 414 can be disposed between first and second tube end supports 416, 418. In some embodiments, precipitation tube assembly 410 can be cylindrical. For example, precipitation tube 412, 414 and first and second tube end supports 416, 418 can be cylindrical. In some embodiments, precipitation tube assembly 410 can include one or more baffles configured to direct flow of gas discharge medium 213 in packed-bed filter assembly 400 along the entire length of packed-bed filter assembly 400. For example, as shown in FIG. 3, precipitation tube 412, 414 can include small openings 420, 422 (e.g., slot, notch, aperture, etc.) at distal ends of precipitation tube 412, 414 in order to form gaps between precipitation tube 412, 414 and first and second tube end supports 416, 418.

In some embodiments, precipitation tube assembly 410 can include a plurality of precipitation tubes 412, 414 between first and second tube end supports 416, 418. For example, precipitation tube assembly 410 can include first precipitation tube 412 and second precipitation tube 414. In some embodiments, first and second precipitation tubes 412, 414 can be concentric. For example, first (outer) precipitation tube 412 can be disposed about second (inner) precipitation tube 414. In some embodiments, precipitation tube assembly 410 can include a glass-like component, a crystalline component, a metal, and/or an oxide. For example, precipitation tube 412, 414 can include aluminum, duralumin, alumina, nickel, monel, brass, copper, zinc, calcium boride, calcium fluoride, and/or some combination thereof.

Exemplary Flow Diagram

FIG. 5 illustrates flow diagram 500 for trapping metal fluoride dust 208 in gas discharge stage 210, according to an embodiment. It is to be appreciated that not all steps in FIG. 5 are needed to perform the disclosure provided herein. Further, some of the steps may be performed simultaneously, sequentially, and/or in a different order than shown in FIG.

5. Flow diagram 500 shall be described with reference to FIGS. 2-4. However, flow diagram 500 is not limited to those example embodiments.

In step 502, as shown in the example of FIGS. 3 and 4, precipitation tube assembly 410 including first and second precipitation tubes 412, 414 between first and second tube end supports 416, 418 can be assembled. In some embodiments, first and second precipitation tubes 412, 414 can be arranged concentrically in precipitation tube assembly 410. For example, first (outer) precipitation tube 412 can be disposed about second (inner) precipitation tube 414. In some embodiments, precipitation tube assembly 410 can include one or more baffles to separate first and second pluralities of beads 406, 408. For example, second precipitation tube 414 can have a reduced length to form openings (e.g., first and second small openings 420, 422) and be utilized as a baffle disposed between first and second pluralities of beads 406, 408.

In step 504, as shown in the example of FIGS. 3 and 4, a plurality of packed-bed filters 402, 404 in precipitation tube assembly 410 can be assembled around electrostatic precipitator 320 to form packed-bed filter assembly 400. Each packed-bed filter 402, 404 includes a plurality of beads 406, 408 configured to absorb metal fluoride dust 208 in gas discharge medium 213. In some embodiments, the assembling the plurality of packed-bed filters 402, 404 includes filling the plurality of beads 406, 408 between the plurality of precipitation tubes 412, 414. For example, first plurality of beads 406 can be filled between first and second precipitation tubes 412, 414 and second plurality of beads 408 can be filled between second precipitation tube 414 and electrostatic precipitator 320. In some embodiments, the filling includes filling first plurality of beads 406 between first and second precipitation tubes 412, 414 different from second plurality of beads 408 filled between second precipitation tube 414 and electrostatic precipitator 320. For example, first plurality of beads 406 can have a different diameter, a different surface area, a different packing density, a different material, and/or a different combination of beads than second plurality of beads 408.

In step 506, as shown in the example of FIGS. 3 and 4, packed-bed filter assembly 400 can be inserted into MFT 300.

In step 508, as shown in the example of FIGS. 2-4, gas discharge medium 213 can be directed to flow through MFT 300.

In step 510, as shown in the example of FIGS. 2-4, metal fluoride dust 208 can be trapped in packed-bed filter assembly 400.

In some embodiments, the method can further include removing the plurality of beads 406, 408 from packed-bed filter assembly 400, washing the plurality of beads 406, 408, and reassembling the plurality of beads 406, 408 in packed-bed filter assembly 400. In some embodiments, the method can further include removing the plurality of beads 406, 408 from packed-bed filter assembly 400 and reassembling a second plurality of beads (e.g., new beads similar to beads 406, 408) in packed-bed filter assembly 400.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments in the context of optical lithography, it will be appreciated that embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments have been described above, it will be appreciated that the embodiments may be practiced otherwise than as described. The description is not intended to limit the scope of the claims.

It is to be appreciated that the Detailed Description section, and not the Summary and Abstract sections, is intended to be used to interpret the claims. The Summary and Abstract sections may set forth one or more but not all exemplary embodiments as contemplated by the inventor(s), and thus, are not intended to limit the embodiments and the appended claims in any way.

The embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the embodiments that others can, by applying knowledge within the skill of the art, readily modify and/or adapt for various applications such specific embodiments, without undue experimentation, without departing from the general concept of the embodiments. Therefore, such adaptations and modifications are intended to be within the meaning and range of equivalents of the disclosed embodiments, based on the teaching and guidance presented herein.

Other aspects of the invention are set out in the following numbered clauses.

1. A light source apparatus comprising:
   a gas discharge stage comprising:
   an optical amplifier comprising a chamber configured to hold a gas discharge medium, the gas discharge medium outputting a light beam; and
   a set of optical elements configured to form an optical resonator around the optical amplifier; and
   a metal fluoride trap configured to trap metal fluoride dust generated from the gas discharge stage, the metal fluoride trap comprising:
   an electrostatic precipitator; and
   a packed-bed filter disposed around the electrostatic precipitator,
   wherein the packed-bed filter comprises a plurality of beads configured to absorb metal fluoride dust.

2. The light source apparatus of clause 1, wherein the packed-bed filter comprises a total surface area configured to control a flow rate of the gas discharge medium through the metal fluoride trap.

3. The light source apparatus of clause 1, wherein the packed-bed filter comprises a plurality of packed-bed filters separated by a baffle.

4. The light source apparatus of clause 3, wherein each of the plurality of packed-bed filters is different.

5. The light source apparatus of clause 4, wherein each of the plurality of packed-bed filters comprises a different surface area.

6. The light source apparatus of clause 4, wherein each of the plurality of packed-bed filters comprises a different packing density.

7. The light source apparatus of clause 1, wherein each of the plurality of beads is spherical and comprises a smooth polished exterior surface.

8. The light source apparatus of clause 1, wherein the plurality of beads comprises a fluoride corrosion resistant material.

9. The light source apparatus of clause 1, wherein the plurality of beads comprises a first plurality of beads and a second plurality of beads different from the first plurality of beads.

10. The light source apparatus of clause 1, wherein the gas discharge medium comprises an excimer medium.

11. The light source apparatus of clause 10, wherein the gas discharge medium comprises $F_2$, ArF, KrF, and/or XeF.

12. The light source apparatus of clause 1, wherein the set of optical elements comprises: an optical coupler (OC) in optical communication with a first optical port of the chamber; and a linewidth narrowing module (LNM) in optical communication with a second optical port of the chamber.

13. The light source apparatus of clause 1, further comprising:
a pressure control system coupled to the gas discharge stage and configured to direct a portion of the gas discharge medium to flow through an input port of the metal fluoride trap, through the packed-bed filter, and through one or more output ports of the metal fluoride trap.
14. A metal fluoride trap configured to trap metal fluoride dust generated in a gas discharge medium of a gas discharge stage, the metal fluoride trap comprising:
an electrostatic precipitator; and
a packed-bed filter disposed around the electrostatic precipitator,
wherein the packed-bed filter comprises a plurality of beads configured to absorb metal fluoride dust in the gas discharge medium.
15. The metal fluoride trap of clause 14, wherein the packed-bed filter comprises a total surface area configured to control a flow rate of the gas discharge medium through the metal fluoride trap.
16. The metal fluoride trap of clause 14, wherein each of the plurality of beads is spherical.
17. The metal fluoride trap of clause 16, wherein each bead comprises a diameter of about 1 mm to about 10 mm.
18. The metal fluoride trap of clause 16, wherein each bead comprises a smooth polished exterior surface.
19. The metal fluoride trap of clause 14, wherein the plurality of beads comprises a fluoride corrosion resistant material.
20. The metal fluoride trap of clause 19, wherein the fluoride corrosion resistant material comprises a glass-like component, a crystalline component, a metal, and/or an oxide.
21. The metal fluoride trap of clause 19, wherein the fluoride corrosion resistant material comprises aluminum, duralumin, alumina, nickel, monel, brass, copper, zinc, calcium boride, and/or calcium fluoride.
22. The metal fluoride trap of clause 14, wherein the plurality of beads comprises a first plurality of beads and a second plurality of beads different from the first plurality of beads.
23. The metal fluoride trap of clause 22, wherein the first plurality of beads comprises a first dimension and the second plurality of beads comprises a second dimension different from the first dimension.
24. The metal fluoride trap of clause 22, wherein the first plurality of beads comprises a first material and the second plurality of beads comprises a second material different from the first material.
25. A method of trapping metal fluoride dust generated in a gas discharge medium of a gas discharge stage in a metal fluoride trap, the method comprising:
assembling a precipitation tube assembly comprising a plurality of precipitation tubes between a first tube end support and a second tube end support;
assembling a plurality of packed-bed filters in the precipitation tube assembly around an electrostatic precipitator to form a packed-bed filter assembly, wherein each packed-bed filter comprises a plurality of beads configured to absorb metal fluoride dust in the gas discharge medium;
inserting the packed-bed filter assembly into the metal fluoride trap;

directing the gas discharge medium to flow through the metal fluoride trap; and trapping metal fluoride dust in the packed-bed filter assembly.
26. The method of clause 25, wherein the assembling the plurality of packed-bed filters comprises filling the plurality of beads between the plurality of precipitation tubes.
27. The method of clause 26, wherein the filling comprises filling an inner plurality of beads between an inner plurality of precipitation tubes and filling an outer plurality of beads different from the inner plurality of beads between an outer plurality of precipitation tubes.
28. The method of clause 27, wherein the outer plurality of beads comprises a surface area and/or a packing density different from the inner plurality of beads.
29. The method of clause 25, further comprising removing the plurality of beads from the packed-bed filter assembly, washing the plurality of beads, and reassembling the plurality of beads in the packed-bed filter assembly.
30. The method of clause 25, further comprising removing the plurality of beads from the packed-bed filter assembly and reassembling a second plurality of beads in the packed-bed filter assembly.

The breadth and scope of the embodiments should not be limited by any of the above-described exemplary embodiments, but should be defined only in accordance with the following claims and their equivalents.

What is claimed is:
1. A light source apparatus comprising:
a gas discharge stage comprising:
an optical amplifier comprising a chamber configured to hold a gas discharge medium, the gas discharge medium outputting a light beam; and
a set of optical elements configured to form an optical resonator around the optical amplifier; and
a metal fluoride trap configured to trap metal fluoride dust generated from the gas discharge stage, the metal fluoride trap comprising:
an electrostatic precipitator; and
a packed-bed filter disposed around the electrostatic precipitator,
wherein the packed-bed filter comprises a plurality of beads configured to absorb metal fluoride dust.
2. The light source apparatus of claim 1, wherein the packed-bed filter comprises a plurality of packed-bed filters separated by a baffle.
3. The light source apparatus of claim 2, wherein each of the plurality of packed-bed filters comprises a different surface area.
4. The light source apparatus of claim 2, wherein each of the plurality of packed-bed filters comprises a different packing density.
5. The light source apparatus of claim 1, wherein the plurality of beads comprises a fluoride corrosion resistant material.
6. The light source apparatus of claim 1, wherein the plurality of beads comprises a first plurality of beads and a second plurality of beads different from the first plurality of beads.
7. The light source apparatus of claim 1, wherein the gas discharge medium comprises an excimer medium.
8. The light source apparatus of claim 7, wherein the gas discharge medium comprises $F_2$, ArF, KrF, and/or XeF.
9. The light source apparatus of claim 1, wherein the set of optical elements comprises:

an optical coupler (OC) in optical communication with a first optical port of the chamber; and a linewidth narrowing module (LNM) in optical communication with a second optical port of the chamber.

10. The light source apparatus of claim 1, further comprising:

a pressure control system coupled to the gas discharge stage and configured to direct a portion of the gas discharge medium to flow through an input port of the metal fluoride trap, through the packed-bed filter, and through one or more output ports of the metal fluoride trap.

11. A metal fluoride trap configured to trap metal fluoride dust generated in a gas discharge medium of a gas discharge stage, the metal fluoride trap comprising:

an electrostatic precipitator; and a packed-bed filter disposed around the electrostatic precipitator, wherein the packed-bed filter comprises a plurality of beads configured to absorb metal fluoride dust in the gas discharge medium.

12. The metal fluoride trap of claim 11, wherein each bead is spherical and comprises a smooth polished exterior surface.

13. The metal fluoride trap of claim 11, wherein the plurality of beads comprises a fluoride corrosion resistant material that comprises a glass-like component, a crystalline component, a metal, and/or an oxide.

14. The metal fluoride trap of claim 11, wherein the plurality of beads comprises aluminum, duralumin, alumina, nickel, monel, brass, copper, zinc, calcium boride, and/or calcium fluoride.

15. The metal fluoride trap of claim 11, wherein the plurality of beads comprises a first plurality of beads having a first dimension and a second plurality of beads having a second dimension different from the first dimension.

16. The metal fluoride trap of claim 11, wherein the first plurality of beads comprises a plurality of beads comprising a first material and a second plurality of beads comprising a second material different from the first material.

17. A method of trapping metal fluoride dust generated in a gas discharge medium of a gas discharge stage in a metal fluoride trap, the method comprising:

assembling a precipitation tube assembly comprising a plurality of precipitation tubes between a first tube end support and a second tube end support;

assembling a plurality of packed-bed filters in the precipitation tube assembly around an electrostatic precipitator to form a packed-bed filter assembly, wherein each packed-bed filter comprises a plurality of beads configured to absorb metal fluoride dust in the gas discharge medium;

inserting the packed-bed filter assembly into the metal fluoride trap;

directing the gas discharge medium to flow through the metal fluoride trap; and trapping metal fluoride dust in the packed-bed filter assembly.

18. The method of claim 17, wherein the assembling the plurality of packed-bed filters comprises filling the plurality of beads between the plurality of precipitation tubes.

19. The method of claim 18, wherein the filling comprises filling an inner plurality of beads between an inner plurality of precipitation tubes and filling an outer plurality of beads different from the inner plurality of beads between an outer plurality of precipitation tubes.

20. The method of claim 19, wherein the outer plurality of beads comprises a surface area and/or a packing density different from the inner plurality of beads.

21. The method of claim 17, further comprising removing the plurality of beads from the packed-bed filter assembly, washing the plurality of beads, and reassembling the plurality of beads in the packed-bed filter assembly.

* * * * *